(12) United States Patent
Suzuka et al.

(10) Patent No.: US 9,012,901 B2
(45) Date of Patent: Apr. 21, 2015

(54) PHOTOELECTRIC CONVERSION ELEMENT

(75) Inventors: Michio Suzuka, Osaka (JP); Takashi Sekiguchi, Osaka (JP); Naoki Hayashi, Kyoto (JP); Takeyuki Yamaki, Nara (JP); Hiroyuki Nishide, Tokyo (JP); Kenichi Oyaizu, Tokyo (JP); Fumiaki Kato, Tokyo (JP)

(73) Assignees: Panasonic Corporation, Osaka (JP); Waseda University, Tokyo (JP)

( * ) Notice: Subject to any disclaimer, the term of this patent is extended or adjusted under 35 U.S.C. 154(b) by 7 days.

(21) Appl. No.: 13/997,699

(22) PCT Filed: Mar. 5, 2012

(86) PCT No.: PCT/JP2012/055517
§ 371 (c)(1),
(2), (4) Date: Jun. 25, 2013

(87) PCT Pub. No.: WO2012/121191
PCT Pub. Date: Sep. 13, 2012

(65) Prior Publication Data
US 2013/0285043 A1    Oct. 31, 2013

(30) Foreign Application Priority Data

Mar. 10, 2011 (JP) ................. 2011-053584

(51) Int. Cl.
*H01L 51/30* (2006.01)
*H01L 51/00* (2006.01)
(Continued)

(52) U.S. Cl.
CPC .............. *H01L 51/0072* (2013.01); *C09B 5/62* (2013.01); *H01L 51/0053* (2013.01); *H01L 51/424* (2013.01); *Y02E 10/549* (2013.01); *Y02E 10/542* (2013.01)

(58) Field of Classification Search
None
See application file for complete search history.

(56) References Cited

U.S. PATENT DOCUMENTS

| 4,927,721 A | 5/1990 | Gratzel et al. |
| 5,084,365 A | 1/1992 | Gratzel et al. |

(Continued)

FOREIGN PATENT DOCUMENTS

| EP | 0 718 288 B1 | 6/2005 |
| JP | 06-032789 A | 2/1994 |

(Continued)

OTHER PUBLICATIONS

P. Simon et al., Conventional Electron Microscopy and Electron Holography of Organic Solar Cells, Advanced Functional Materials, Jul. 2004, Wiley-VCH Verlag GmbH & Co. KGaA, Weinheim, vol. 14, No. 7, pp. 669-676.*
(Continued)

*Primary Examiner* — Fernando L Toledo
*Assistant Examiner* — Victoria K Hall
(74) *Attorney, Agent, or Firm* — Renner, Otto, Boisselle & Sklar, LLP

(57) ABSTRACT

A photoelectric conversion element having high photovoltaic conversion efficiency is provided.
The photoelectric conversion element includes a first electrode, a second electrode arranged opposite to the first electrode, and an electron transport layer provided on a face of the first electrode, and the face is opposite to the second electrode. The photoelectric conversion element further includes a photosensitizer supported on the electron transport layer and a hole transport layer interposed between the first electrode and the second electrode. The electron transport layer contains a perylene imide derivative of [Chemical Formula 1].

[Chemical Formula 1]

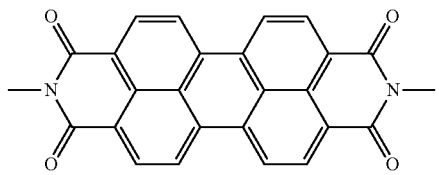

1 Claim, 1 Drawing Sheet

(51) Int. Cl.
*C09B 5/62* (2006.01)
*H01L 51/42* (2006.01)

(56) References Cited

U.S. PATENT DOCUMENTS

| | | | |
|---|---|---|---|
| 5,683,832 | A | 11/1997 | Bonhote et al. |
| 5,683,842 | A | 11/1997 | Duff et al. |
| 5,728,487 | A | 3/1998 | Gratzel et al. |
| 5,756,744 | A | 5/1998 | Duff et al. |
| 8,378,336 | B2 | 2/2013 | Kitamura |
| 2003/0062080 | A1 | 4/2003 | Satoh et al. |
| 2006/0235163 | A1* | 10/2006 | Yamamoto et al. ........ 525/330.3 |
| 2009/0315025 | A1 | 12/2009 | Kitamura |
| 2011/0042651 | A1 | 2/2011 | Koenemann et al. |

FOREIGN PATENT DOCUMENTS

| | | |
|---|---|---|
| JP | 2664194 B2 | 6/1997 |
| JP | 10-259310 A | 9/1998 |
| JP | 2002-094085 A | 3/2002 |
| JP | 2003-168492 A | 6/2003 |
| JP | 2003-100360 A | 4/2004 |
| JP | 2004-221495 A | 8/2004 |
| JP | 2004-228537 A | 8/2004 |
| JP | 2009-532436 A | 9/2009 |
| JP | 2010-003831 A | 1/2010 |
| WO | WO 95/18456 A1 | 7/1995 |

OTHER PUBLICATIONS

K. Naito et al., Molecular Design, Syntheses, and Physical Properties of Nonpolymeric Amorphous Dyes for Electron Transport, J. Phys. Chem. A, 1997, American Chemical Society, vol. 101, pp. 2350-2357.*
Jung Yun Do et al., Soluble Asymmetric Perylene Derivatives for Organic Solar Cells, 2007, Wiley InterScience, Macromol. Symp. 2007, 249-250, pp. 461-465, all pages.*
Nikolai L. Georgiev et al., Design and synthesis of novel fluorescence sensing perylene diimides based on photoinduced electron transfer, May 5, 2011, Elsevier, Dyes and Pigments, vol. 91, 332-339, all pages.*
Michael W. Holman et al., Single-Molecule Spectroscopy of Interfacial Electron Transfer, Sep. 23, 2003, J. Am. Chem. Soc. vol. 125, pp. 12649-12654, all pages.*
Chun Huang et al., Photo-induced charge transfer and non-linear absorption in dyads composed of a two-photon-absorbing donor and a perylene diimide acceptor, Sep. 8, 2011, The Royal Society of Chemistry, J. Mater. Chem. vol. 21, pp. 16119-16128, all pages.*
Julien Kelber et al., Columnar Benzoperylene-Hexa and Tetracarboxylic Imides and Esters: Synthesis, Mesophase Stabilisation and Observation of Charge-Transfer Interactions between Electron-Donating Esters and Electron-Accepting Imides, 2011, Wiley-VCH Verlag GmbH & Co. KGaA, vol. 17, pp. 8145-8155, all pages.*
T. Korzdorfer et al., Fluorescence quenching in an organic donor-acceptor dyad: A first principles study, Jul. 21, 2009, AIP Publishing, Journal of Chemical Physics, vol. 131, p. 034310-1 to 034310-8, all pages.*
Erika Kozma et al., Synthesis of donor-acceptor poly(perylene diimide-altoligothiophene) copolymers as n-type materials for polymeric solar cells, 2010, Elsevier, Polymer, vol. 51, pp. 2264-2270, all pages.*
Yong Li et al., Mixed (porphyrinato)(phthalocyaninato) rare-earth(III) double-decker complexes for broadband light harvesting organic solar cells, Jun. 28, 2011, The Royal Society of Chemistry, J. Mater. Chem. vol. 21, pp. 11131-11141, all pages.*
L. Schmidt-Mende et al., Self-Organized Discotic Liquid Crystal for High-Efficiency Organic Photovoltaics, Aug. 10, 2011, American Association for the Advancement of Science, Science, vol. 293, pp. 1119-1122.*
Safa Shoaee et al., Acceptor Energy Level Control of Charge Photogeneration in Organic Donor/Acceptor Blends, Aug. 30, 2010, American Chemical Society, J. Am. Chem. Soc., vol. 132, pp. 12919-12926, all pages.*
Gulsah Turkmen et al., Highly soluble perylene dyes: Synthesis, photophysical and electrochemical characterizations, Jun. 11, 2009, Elsevier, Dyes and Pigments, vol. 83, pp. 297-303, all pages.*
International Search Report for corresponding International Application No. PCT/JP2012/055517 mailed May 22, 2012.
Form PCT/ISA/237 for corresponding International Application No. PCT/JP2012/055517 dated May 22, 2012.
Denki Kagaku, "The recent development of the polymer solid electrolyte", (Electrochemistry) vol. 65, No. 11, p. 923 (1997) and English Abstract.
Papageorgiou et al., "The Performance and Stability of Ambient Temperature Molten Salts for Solar Cell Applications", J. Electrochem. Soc., vol. 143, No. 10 p. 3099 (1996).
Bonhote et al., "Hydrophobic, Highly Conductive Ambient-Temperature Molten Salts", Inorg. Chem., vol. 35, p. 1168 (1996).
C. W. Tang, "Two-layer organic photovoltaic cell", Applied Physics Letters, vol. 48, Issue 2, p. 183-185 (1985).

* cited by examiner

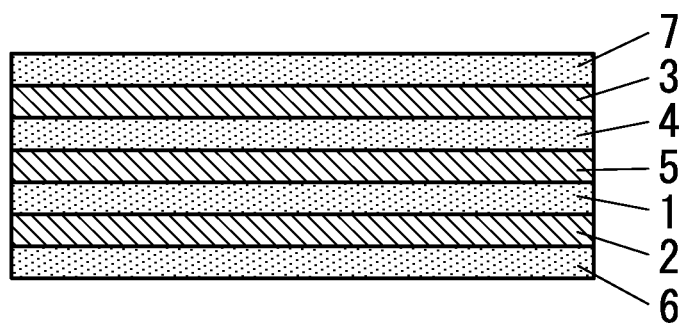

PHOTOELECTRIC CONVERSION ELEMENT

TECHNICAL FIELD

The present invention relates to a photoelectric conversion element converting light into electricity or electricity into light.

BACKGROUND ART

In recent years, power generation devices using photovoltaic conversion, such as a photovoltaic cell and a solar cell, light-emitting devices such as an organic EL device, optical display devices such as an electrochromic display device and electronic paper, sensor devices sensing, for example, temperature and light, and other devices employ photoelectric conversion elements.

Among them, the photoelectric conversion elements in a solar cell and other devices have actually employed a pn junction device, and various photoelectric conversion elements have been studied for photo-electrochemical devices (for example, see Patent Literature 1). The photoelectric conversion element includes an electrode with an electron transport layer, a counter electrode, and an electrolyte as a hole transport layer and other layers interposed between the electrodes. The electron transport layer typically supports a dye as a photosensitizer, and such a structure allows the element to be used as a dye-sensitized solar cell. Applying light to the electron transport layer causes the electron transport layer to generate charges; the charges move through the hole transport layer; and electricity can be extracted to the outside from the electrode with the electron transport layer as the negative electrode and from the counter electrode as the positive electrode.

For photoelectrochemical devices including such a photoelectric conversion element, a method of providing a radical compound in contact with the electron transport layer has been developed (for example, see Patent Literature 2). In the method, carriers (electrons or holes) generated by photoirradiation to the electron transport layer participate in redox reaction (oxidation-reduction reaction) of the radical compound. The radical compound undergoes electrochemically oxidation or reduction to become a redox couple. This accelerates the response speed to photoirradiation to the electron transport layer and such a device obtains excellent stability and reproducibility.

CITATION LIST

Patent Literatures

Patent Literature 1: Japanese Patent No. 2664194
Patent Literature 2: JP-A No. 2003-100360

SUMMARY OF INVENTION

Technical Problem

The above method unfortunately achieves insufficient reactivity between the radical compound as a redox couple and a photosensitizer. Such an insufficient reactivity leads to inefficient charge separation at the bonded interface between the photosensitizer and the radical compound and to inefficient charge transport through the radical compound, resulting in insufficient photovoltaic conversion efficiency.

In view of the above circumstances, the present invention has an object to provide a photoelectric conversion element having high photovoltaic conversion efficiency.

Solution to Problem

A photoelectric conversion element of the present invention includes a first electrode, a second electrode arranged opposite to the first electrode, an electron transport layer provided on a face of the first electrode, the face being opposite to the second electrode, a photosensitizer supported on the electron transport layer, and a hole transport layer interposed between the first electrode and the second electrode, and the electron transport layer contains a perylene imide derivative of [Chemical Formula 1].

[Chemical Formula 1]

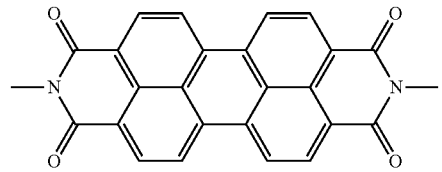

It is preferable that the perylene imide derivative have a structure of [Chemical Formula 2] and the substituent R be an alkyl group.

[Chemical Formula 2]

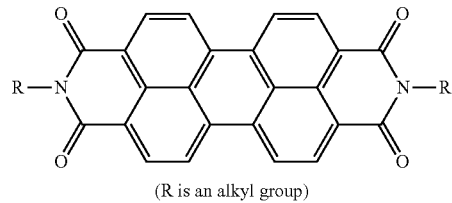

(R is an alkyl group)

It is preferable that the substituent R be an alkyl group having a branched structure.

Advantageous Effects of Invention

The present invention can suppress the recombination of charges at a charge separation interface after charge separation thereby to improve charge transport characteristics in the hole transport layer and consequently can provide a photoelectric conversion element excellent in the conversion efficiency between light and electricity.

BRIEF DESCRIPTION OF DRAWINGS

FIG. 1 is a schematic cross-sectional view showing an example of an embodiment of the present invention.

DESCRIPTION OF EMBODIMENTS

Embodiments for carrying out the present invention will be described hereinafter.

FIG. 1 shows an example of a photoelectric conversion element of the present invention. A pair of substrates 6 and 7 is arranged opposite to each other. On the inner surface of one substrate 6, a first electrode 2 is provided; on the inner surface of the other substrate 7, a second electrode 3 is provided; and the first electrode 2 and the second electrode 3 are opposite to each other. On the surface of the first electrode 2 opposite to the substrate 6, an electron transport layer 1 is provided; and between the substrates 6 and 7, a hole transport layer 4 is provided. The hole transport layer 4 may be provided on the surface of the second electrode 3 opposite to the substrate 7.

Of the pair of substrates 6 and 7, the substrate 6 attaching the first electrode 2 provided with the electron transport layer 1 may be formed of optically transparent glass or film or a metal processed so as to be an optically transparent. For example, the metal preferably has a linear (stripe) pattern, a wavy line pattern, a lattice (mesh) pattern, a punching metal form, or a particle aggregate form from the viewpoint of economic advantages due to the reduction in material cost because light can pass through openings and no transparent conductive material is required. A substrate having such a form may be used in combination with a structural material such as plastic and glass from the viewpoint of durability of the element.

For an element in which the other substrate 7 serves as the light incident substrate, the substrate 6 may employ an optically opaque material. Such a substrate may be electrically conductive or not. However, a substrate working as an electrode preferably employs an electrically conductive material. Usable examples of the material include carbon, aluminum, titanium, iron, nickel, copper, rhodium, indium, tin, zinc, platinum, gold, and an alloy containing at least one of the materials, such as stainless steel. In the present invention, a radical compound is unlikely to corrode metals as compared with halogen ions and other substances as described later, and thus the substrates 6 and 7, the first electrode 2, and the second electrode 3 may employ commonly used metals.

The substrate 7 may be formed of the same material as that for the substrate 6. The substrate 7 may be translucent or not and is preferably transparent because such a structure allows light to enter from both the substrates 6 and 7. In an element including the substrate 6 employing a metal foil as above, the substrate 7 is preferably formed of optically transparent material.

The first electrode 2 is formed as a film on the substrate 6 and serves as the negative electrode of the photoelectric conversion element. The first electrode 2 may be formed of a metal alone or formed by lamination of a conductive material layer on a substrate or a film. Preferred examples of the conductive material include metals such as platinum, gold, silver, copper, aluminum, rhodium, and indium, carbon, electrically conductive metal oxides such as an indium-tin composite oxide, tin oxide doped with antimony, and tin oxide doped with fluorine, and composites of the compounds. The present invention employs a perylene imide compound having high electron transfer rate. Thus, in order to suppress the leakage of electrons on the surface of the first electrode 2, that is, in order to provide rectification, the electrode preferably employs a material in which the compound is coated with, for example, silicon oxide, tin oxide, titanium oxide, zirconium oxide, or aluminum oxide.

The first electrode 2 preferably has a smaller surface resistance and the surface resistance range is preferably 200Ω/☐ or less and more preferably 50Ω/☐ or less. The lower limit of the surface resistance is not particularly limited and is typically 0.1Ω/☐.

The first electrode 2 preferably has a higher light transmittance and the light transmittance range is preferably 50% or more and more preferably 80% or more. The first electrode 2 preferably has a film thickness ranging from 1 to 100 nm. A film thickness within the range enables the formation of the electrode film having a uniform film thickness and is unlikely to reduce light transmittance, and this allows a sufficient amount of light to enter into the electron transport layer 1. For an element including a transparent first electrode 2, light preferably enters from the first electrode 2 to which the electron transport layer 1 is attached.

The second electrode 3 serves as the positive electrode of the photoelectric conversion element and can be formed in a similar manner to that for the first electrode 2. The second electrode 3 preferably employs a material having catalytic action for giving electrons to a reduced form of an electrolyte used in the hole transport layer 4 described later in order to efficiently work as the positive electrode of the photoelectric conversion element. Examples of such a material include metals such as platinum, gold, silver, copper, aluminum, rhodium, and indium, carbon materials such as graphite, carbon nanotubes, and platinum supported on carbon, electrically conductive metal oxides such as an indium-tin composite oxide, tin oxide doped with antimony, and tin oxide doped with fluorine, and electrically conductive polymers such as polyethylenedioxythiophene, polypyrrole, and polyaniline. Among them, for example, platinum, graphite, and polyethylenedioxythiophene are particularly preferred.

The substrate 7 provided with the second electrode 3 may have a transparent conductive film (not shown in the schematic) on the surface attaching the second electrode 3. The transparent conductive film may be formed of any of the materials exemplified as those for the first electrode 2, for example. In this case, the second electrode 3 is preferably also transparent. For an element including the transparent second electrode 3, light may enter from the second electrode 3 side or from both sides of the first electrode 2 and the second electrode 3. This is because such a structure has a beneficial effect, for example, on the case having the possibility of light irradiation from both sides of the substrates 6 and 7 due to the effect of reflected light or other effects.

The electron transport layer 1 used in the present invention contains a perylene imide derivative having [Chemical Formula 1] as a part in the molecule.

The perylene imide derivative used in the electron transport layer 1 will be described here in detail.

The perylene imide derivative has, as a part in the molecule, an oxidation-reduction site that can be repeatedly oxidized and reduced. The oxidation-reduction (oxidation-reduction reaction) means that an ion, an atom, or a compound donates and accepts electrons. The oxidation-reduction site is a site capable of stably donating and accepting electrons by oxidation-reduction reaction (redox reaction). The "oxidation-reduction site that can be repeatedly oxidized and reduced" means a site that is reversibly converted into an oxidized form and a reduced form by oxidation-reduction reaction.

The perylene imide derivative has a large π conjugated plane, and this enables rapid intermolecular electron transport in the photoelectric conversion element. The electrons in a perylene imide derivative accepting electrons are widely distributed on the π-conjugation, and this interferes with reverse electron transfer to the holes present in hole transport layer.

The perylene imide derivative is a compound known to cause intermolecular stacking. In order to improve film formability of the perylene imide derivative, it is effective to suppress the intermolecular stacking. The degree of the intermolecular stacking is known to strongly depend on substituents substituted on the nitrogen atoms of the perylene imide derivative.

In the present invention, in order to suppress the intermolecular stacking thereby to improve the film formability of the perylene imide derivative, the perylene imide derivative preferably has a substituent R as shown in [Chemical Formula 2]. The substituent R can be selected from various substituents and examples of the substituent include a hydrogen atom, a substituted or unsubstituted aliphatic hydrocarbon group (alkyl group) having 1 to 30 carbon atoms, a substituted or unsubstituted aromatic hydrocarbon group having 1 to 30 carbon atoms, a halogen, a hydroxyl group, a nitro group, a nitroso group, a cyano group, an alkoxy group, an aryloxy group, and an acyl group. Among them, the substituent R is preferably an alkyl group and more preferably an alkyl group having 5 or more carbon atoms because such a substituent can suppress the intermolecular stacking of the perylene imide derivative thereby to improve the film formability. An alkyl group having a branched structure is particularly preferred. In this case, the perylene imide derivative has a smaller molecular weight but is a bulky compound. Such a compound can increase the degree of freedom of a device structure, such as the solubility in various solvents. In [Chemical Formula 2], two Rs may be the same substituent or may be different to each other.

In the present invention, the electron transport layer 1 contains the perylene imide derivative having an electron state widely distributed on the π-conjugation as described above, thereby suppressing the recombination of charges at a charge separation interface after charge separation. This can improve charge transport characteristics in the hole transport layer. In particular, a perylene imide derivative having a bulky functional group as the substituent R can obtain a lower probability of being in contact with holes present in the hole transport layer 4, thereby suppressing reverse electron reaction. This can further increase voltage.

The electron transport layer 1 formed on the surface of the first electrode 2 preferably has a film thickness ranging from 0.01 to 100 μm. A film thickness within the range can achieve sufficient photovoltaic conversion effect and can reduce the possibility of lowering the transmittance of visible light and near infrared light. The electron transport layer 1 more preferably has a film thickness ranging from 0.5 to 50 μm and particularly preferably ranging from 1 to 20 μm.

The electron transport layer 1 is preferably formed by a wet process of applying a solution or others because such a process is simpler and inexpensive. Especially for an electron transport layer 1 formed of what is called a polymeric organic compound having a number average molecular weight of 1,000 or more, the wet process is preferred from the viewpoint of formability. Examples of the wet process include spin coating, drop casting in which a liquid is dropped and dried, and printing such as screen printing and gravure printing. In addition, vacuum processes such as sputtering and depositing can be employed.

On the surface of the electron transport layer 1 formed as above, a photosensitizer 5 is preferably supported. In such a structure, the photosensitizer 5 forms the interface of photocharge separation, thereby further improving photovoltaic conversion efficiency.

The photosensitizer 5 can employ known materials and usable examples of the materials include both inorganic materials such as electron transport layer ultrafine particles and organic materials such as a dye and a pigment. The dyes are preferred from the viewpoint of efficient light absorption and charge separation and examples of the dye include a 9-phenylxanthene dye, a coumarin dye, an acridine dye, a triphenylmethane dye, a tetraphenylmethane dye, a quinone dye, an azo dye, an indigo dye, a cyanine dye, a merocyanine dye, and a xanthene dye. Additional examples include a $RuL_2(H_2O)_2$ type ruthenium-cis-diaqua-bipyridyl complex (where L is 4,4'-dicarboxyl-2,2'-bipyridine), transition-metal complexes such as ruthenium-tris ($RuL_3$), ruthenium-bis($RuL_2$), osmium-tris ($OsL_3$), and osmium-bis($OsL_2$), zinc-tetra(4-carboxyphenyl)porphyrin, an iron-hexacyanide complex, and phthalocyanine. Other applicable examples include dyes described in the chapter, DSSC, in "Advanced technology and Material Development of FPD, DSSC, Optical Memory, and Functional Dye" (NTS Inc.). Among them, a dye capable of association on the electron transport layer 1 is preferred because such a dye is densely filled to cover the surface of the electron transport layer 1 and thus serves as an insulator layer. A photosensitizer 5 serving as the insulator layer can impart rectification to generated electrons at a charge separation interface and thus can suppress the recombination of charges after charge separation. Such a photosensitizer can greatly reduce the number of recombination points for electrons and holes present in the electron transport material and the hole transport material. This can further improve the conversion efficiency of the photoelectric conversion element to be obtained.

The dye forming association and having the effect is preferably a dye represented by the structure of [Chemical Formula 3] and specifically preferably a dye represented by the structure of [Chemical Formula 4]. The association can be verified from the absorption spectrum shapes of a dye dissolved in an organic solvent or others and a dye supported on the electron transport layer 1. It is known that association largely changes the spectrum shape from a dye in the former state to that in the latter state.

[Chemical Formula 3]

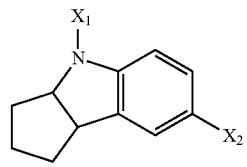

(In the formula, $X_1$ and $X_2$ include at least one of an alkyl group, an alkenyl group, an aralkyl group, an aryl group, and a hetero ring, each optionally having a substituent. $X_2$ has a site to adsorb the electron transport layer 1, such as a carboxyl group, a sulfonyl group, and a phosphonyl group)

[Chemical Formula 4]

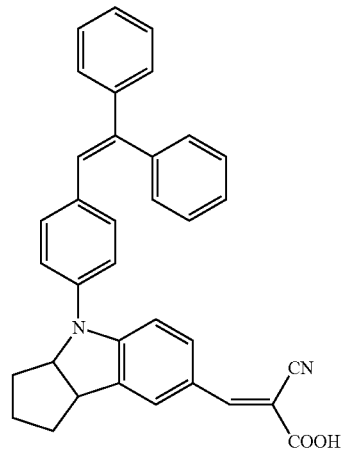

Examples of the electron transport layer ultrafine particles usable for the photosensitizer 5 include electron transport layers of sulfides such as cadmium sulfide, lead sulfide, and silver sulfide. Ultrafine particles may have any particle size as long as such particles have photosensitization effect on the electron transport layer 1 of the present invention and preferably have a particle size ranging from 1 to 10 nm.

Examples of the method of supporting the photosensitizer 5 on the electron transport layer 1 include a method of immersing the substrate 6 provided with the electrode 2 attaching the electron transport layer 1 in a solution dissolving or dispersing the photosensitizer 5. The solution may contain any solvent capable of dissolving the photosensitizer 5, such as water, an alcohol, toluene, and dimethylformamide. During the immersion in a photosensitizer solution for a predetermined period of time, the solution may be heated and refluxed or be sonicated. After the photosensitizer 5 is supported, the substrate is desirably washed or heated and refluxed with an alcohol for removal of an unsupported, remaining photosensitizer 5.

The amount of the photosensitizer 5 supported on the electron transport layer 1 may range from $1\times10^{-10}$ to $1\times10^{-4}$ mol/cm$^2$ and particularly preferably ranges from $0.1\times10^{-8}$ to $9.0\times10^{-6}$ mol/cm$^2$. This is because the photosensitizer 5 in an amount within the range can economically and sufficiently achieve the effect of improving photovoltaic conversion efficiency.

In the present invention, the hole transport layer 4 may employ an electrolyte. In the hole transport layer 4 employing an electrolyte, the electrolyte is one or both of a supporting salt and a pair of oxidation-reduction components including an oxidized form and a reduced form. Examples of the supporting salt (supporting electrolyte) include ammonium salts such as tetrabutylammonium perchlorate, tetraethylammonium hexafluorophosphate, an imidazolium salt, and a pyridinium salt and alkali metal salts such as lithium perchlorate and potassium tetrafluoroborate. The oxidation-reduction component means a pair of substances reversibly converted into an oxidized form and a reduced form by oxidation-reduction reaction. Examples of such an oxidation-reduction component include, but are not limited to, a chlorine compound/chlorine, an iodine compound/iodine, a bromine compound/bromine, a thallium ion (III)/a thallium ion (I), a mercury ion (II)/a mercury ion (I), a ruthenium ion (III)/a ruthenium ion (II), a copper ion (II)/a copper ion (I), an iron ion (III)/an iron ion (II), a nickel ion (II)/a nickel ion (III), a vanadium ion (III)/a vanadium ion (II), and a manganate ion/a permanganate ion. In this case, the oxidation-reduction component serves independent to the oxidation-reduction site of the organic compound contained in the electron transport layer 1. The electrolytic solution may be in a gel form or in an immobilized form.

The solvent used for dissolving an electrolyte used in the hole transport layer 4 is preferably a compound that dissolves the oxidation-reduction component and has excellent ionic conductivity. The solvent to be used may be an aqueous solvent or an organic solvent and is preferably an organic solvent in order to further stabilize the component. Examples of the organic solvent include carbonate compounds such as dimethyl carbonate, diethyl carbonate, methyl ethyl carbonate, ethylene carbonate, and propylene carbonate; ester compounds such as methyl acetate, methyl propionate, and γ-butyrolactone; ether compounds such as diethyl ether, 1,2-dimethoxyethane, 1,3-dioxolane, tetrahydrofuran, and 2-methyltetrahydrofuran; heterocyclic compounds such as 3-methyl-2-oxazolidinone and 2-methylpyrrolidone; nitrile compounds such as acetonitrile, methoxyacetonitrile, and propionitrile; and aprotic polar compounds such as sulfolane, dimethylsulfoxide, and dimethylformamide. These solvents may be used singly or in combination as a mixture of two or more of them. Among them, carbonate compounds such as ethylene carbonate and propylene carbonate; heterocyclic compounds such as γ-butyrolactone, 3-methyl-2-oxazolidinone, and 2-methylpyrrolidone; and nitrile compounds such as acetonitrile, methoxyacetonitrile, propionitrile, 3-methoxypropionitrile, and valeronitrile are preferred.

Using an ionic liquid in the hole transport layer 4 is effective in providing nonvolatility and flame retardancy. In such a case, known, general ionic liquids can be used and examples include an imidazolium ionic liquid, a pyridine ionic liquid, an alicyclic amine ionic liquid, an aliphatic amine ionic liquid, an azonium amine ionic liquid, and ionic liquids having structures described in European Patent No. 718288, specification; International Publication WO 95/18456, pamphlet; Denkikagaku, Vol. 65, No. 11, p. 923 (1997); J. Electrochem. Soc., Vol. 143, No. 10, p. 3099 (1996); and Inorg. Chem., Vol. 35, p. 1168 (1996).

The hole transport layer 4 can also employ a gel electrolyte or a polymer electrolyte. Examples of a gelling agent include a polymer, a gelling agent by polymer cross-linking reaction or other techniques, a gelling agent including a polymerizable multifunctional monomer, and an oil gelling agent. The gel electrolyte and the polymer electrolyte may be a commonly used electrolyte and are preferably vinylidene fluoride polymers such as polyvinylidene fluoride, acrylic acid polymers such as polyacrylic acid, acrylonitrile polymers such as polyacrylonitrile, polyether polymers such as polyethylene oxide, and compounds having an amide structure in the structure.

In the photoelectric conversion element formed as above, applying light to the photosensitizer 5 causes the photosensitizer 5 to generate electrons or holes. Then, the electrons participate in oxidation-reduction reaction of the perylene imide derivative contained in the electron transport layer 1. In other words, the perylene imide derivative accepts the electrons to be oxidized or reduced, thereby yielding a redox couple. Current generated during the reaction can be extracted to the outside from the first electrode 2 as the negative electrode and from the second electrode 3 as the positive electrode.

In particular, the perylene imide derivative contained in the electron transport layer 1 in the present invention can suppress the recombination of charges at a charge separation interface after charge separation, thereby improving the charge transport characteristics in the hole transport layer. Therefore, the present invention can provide the photoelectric conversion element excellent in the conversion efficiency between light and electricity.

EXAMPLES

The present invention will be specifically described with reference to examples next.

Example 1

[Chemical Formula 5]

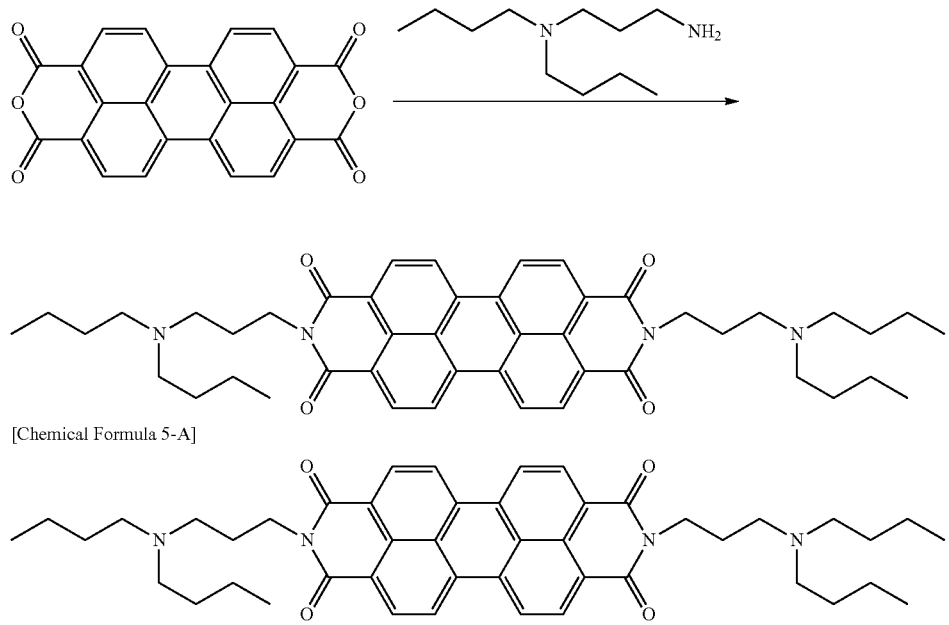

[Chemical Formula 5-A]

First, in accordance with the reaction formula of [Chemical Formula 5], a perylene imide derivative of [Chemical Formula 5-A] was synthesized as below. Imidazole (20 g; 293 mmol), 3,4,9,10-perylenetetracarboxylic acid dianhydride (1 g; 2.55 mmol), anhydrous zinc acetate (0.44 g; 2.40 mmol), and 3-(di-n-butylamino)propylamine (1.24 ml; 6.38 mmol) were mixed and the mixture was stirred in an argon atmosphere at 160° C. for 4 hours. After the completion of the reaction, the mixture was extracted with water and chloroform using a Soxhlet, and then the extract was dried under vacuum to yield a compound B as a dark red powder at a yield of 80%. The compound of [Chemical Formula 5-A] (hereinafter called compound B) had a first reduction potential of about −0.5 V (vs Ag/AgCl) measured by cyclic voltammetry (CV).

$SnO_2$ doped with fluorine was formed on a surface of an electrically conductive glass substrate (manufactured by ASAHI GLASS CO., LTD., 10Ω/□) having a thickness of 1 mm as a substrate 6 to yield a first electrode 2. Onto the first electrode 2, the compound B obtained as above was applied by spin coating to form a film having a thickness of about 30 nm, thereby yielding a working electrode.

Separately, an electrically conductive glass substrate 7 (manufactured by ASAHI GLASS CO., LTD., 10Ω/□) having a thickness of 1 mm and having a surface on which $SnO_2$ doped with fluorine was formed was used, and on the surface of $SnO_2$, platinum was applied by sputtering to yield a second electrode 3.

Then, so as to surround the area in which the electron transport layer 1 film was formed as the working electrode, a hot-melt adhesive ("Bynel" manufactured by DUPONT-MITSUI POLYCHEMICALS CO., LTD.) as a sealer was arranged on the second electrode 3. On the sealer, the substrate 6 formed with the working electrode was stacked and the whole was pressurized and heated to be bonded to each other. The substrate 7 formed with the second electrode 3 had a hole formed with a diamond drill.

Next, in acetonitrile, 0.5 mol/L of 2,2,6,6-tetramethylpiperidine-1-oxyl (TEMPO), 0.5 mol/L of LiTFSI (lithium bistrifluoromethanesulfonylimide), and 0.1 mol/L of t-butylpyridine were dissolved to yield an electrolytic solution. The electrolytic solution was poured from the hole formed with a diamond drill through the glass substrate 7, then the hole was sealed with an ultraviolet hardening resin, and consequently a photoelectric conversion element having the structure as shown in FIG. 1 was produced.

The photoelectric conversion element produced in this manner was irradiated with light having an illuminance of 200 lx using a stabilized fluorescent light; current-voltage characteristics were determined; and conversion efficiency was calculated after stabilization. The measurement environment was one five-hundredth of sunlight, but the photoelectric conversion element can naturally be used in sunlight and the application is not limited. Table 1 shows the results.

Example 2

A photoelectric conversion element was produced in the same manner as in Example 1 except that a compound of [Chemical Formula 6] was used in place of the compound B. Table 1 shows the results.

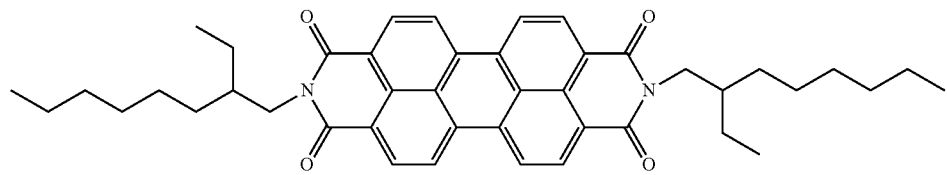

[Chemical Formula 6]

Comparative Example 1

A photoelectric conversion element was produced in the same manner as in Example 1 except that an electron transport layer 1 using a galvi polymer ([Chemical Formula 7]) that is not a perylene imide derivative was used in place of the compound B. Table 1 shows the results.

The galvi polymer was synthesized by polymerization reaction of a galvi monomer synthesized in advance. The synthesis of the galvi monomer and the galvi polymer will be described below.

(Synthesis of Galvi Monomer)

First, to 4-bromo-2,6-di-tert-butylphenol (135.8 g; 0.476 mol), acetonitrile (270 ml) was added, and in an inert atmosphere, N,O-bis(trimethylsilyl)acetamide (BSA) (106.3 g; 129.6 ml) was further added. The whole was stirred and reacted at 70° C. overnight until a crystal was completely precipitated. The precipitated white crystal was filtered, then was dried under vacuum, and was purified by recrystallization in ethanol, thereby yielding (4-bromo-2,6-di-tert-butylphenoxy)trimethylsilane (150.0 g; 0.420 mol) as a white plate crystal.

Next, (4-bromo-2,6-di-tert-butylphenoxy)trimethylsilane (9.83 g; 0.0275 mol) obtained as above was dissolved in tetrahydrofuran (200 ml) in an inert atmosphere and the solution was cooled in dry ice/methanol to −78° C. To the solution, 1.58 M n-butyllithium solution in hexane (15.8 ml; 0.025 mol) was added and the mixture was stirred at a temperature of 78° C. for 30 minutes. After the lithiation, methyl 4-bromobenzoate (1.08 g; 0.005 mol, Mw: 215.0, TCI) dissolved in tetrahydrofuran (75 ml) was added and the mixture was stirred at a temperature from −78° C. to room temperature overnight. The reaction solution was changed from yellow through pale yellow to dark blue that suggested the generation of an anion. After the reaction, a saturated aqueous ammonium chloride solution was added until the reaction solution was completely changed to yellow and then the mixture was extracted with ether/water, thereby yielding a yellow viscous liquid.

Then, the product, THF (10 ml), methanol (7.5 ml), and a stirrer were charged in a reaction container and the mixture was dissolved. Next, 10 N HCl was gradually added until the reaction solution was changed to red-orange and the mixture was stirred for 30 minutes at room temperature. Then, the solvents were removed, and the residue was subjected to extraction with ether/water, solvent removal, fractionation by column chromatography (hexane/chloroform=1/1), and recrystallization in hexane to be purified, thereby affording (p-bromophenyl)hydrogalvinoxyl (2.86 g; 0.0049 mol) as an orange crystal.

Next, the (p-bromophenyl)hydrogalvinoxyl (2.50 g; 4.33 mmol) obtained as above was dissolved in toluene (21.6 ml; 0.2 M) in an inert atmosphere. Then, to the solution, 2,6-di-tert-butyl-p-cresol (4.76 mg; 0.0216 mmol), tetrakis(triphenylphosphine)palladium(0) (0.150 g; 0.130 mmol), and tri-n-butylvinyltin (1.65 g; 5.20 mmol, Mw: 317.1, TCI) were immediately added, and the mixture was heated and stirred at 100° C. for 17 hours.

Then, the reaction product was extracted with ether/water, and the solvent was removed. The residue was fractionated by flash column chromatography (hexane/chloroform=1/3) and was further purified by recrystallization in hexane, thereby yielding p-hydrogalvinoxylstyrene (1.54 g; 2.93 mmol) as an orange microcrystal.

(Polymerization of Galvi Monomer)

In 2 ml of tetrahydrofuran, 1 g of the galvi monomer (p-hydrogalvinoxylstyrene) obtained in Synthesis of Galvi Monomer, 57.7 mg of tetraethylene glycol diacrylate, and 15.1 mg of azobisisobutyronitrile were dissolved. Then, the solution was subjected to nitrogen substitution and was refluxed overnight, thereby polymerizing the galvi monomer to yield a galvi polymer of [Chemical Formula 7]. The galvi polymer had a number average molecular weight of 10,000.

[Chemical Formula 7]

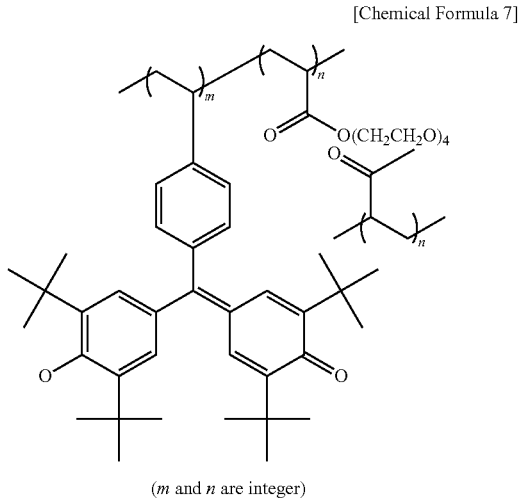

(m and n are integer)

Separately, onto a surface of a glass substrate 6 having a thickness of 1 mm, a transparent electrically conductive oxide of $SnO_2$ doped with fluorine was applied to form a first electrode 2 to be used (manufactured by ASAHI GLASS CO., LTD., 10Ω/□).

Then, 22.5 mg of the galvi compound synthesized as above was dissolved in 4.5 ml of chloroform and the solution was applied onto the surface of the electrode 2 by drop casting to form a film having a thickness of 100 nm.

In the present invention, CV measurement, open circuit voltage, short circuit current, and maximum output were determined by the following methods.

(CV Measurement)

The CV measurement was carried out in 0.1 M tetrabutylammonium perchlorate solution in acetonitrile at a scan speed of 10 mV/sec. The measuring apparatus used was an electrochemical analyzer manufactured by ALS Co., Ltd.

(Measurement of Open Circuit Voltage, Short Circuit Current, and Maximum Output)

While irradiating a region having a plane area of 1 cm² in each photoelectric conversion element obtained in Examples and Comparative Example with light at 200 lx, the open circuit voltage Voc and the short circuit current Jsc of each photoelectric conversion element were determined by IV measurement. The measuring apparatus used was Keithley 2400 sourcemeter (Model 2400 general purpose SourceMeter manufactured by Keithley Instruments, Inc.); the light source used was a fluorescent light (Rapid Fluorescence Light FLR20SW/M manufactured by Panasonic Corporation); and the measurement was carried out in an environment at 25° C. The photoelectric conversion element was evaluated in a condition in which the photovoltaic conversion part having an area of 1 cm² was irradiated with light.

TABLE 1

| Evaluation item | Example 1 | Example 2 | Comparative Example 1 |
|---|---|---|---|
| Open circuit voltage Voc (mV) | 479 | 432 | 550 |
| Short circuit current Jsc (μA/cm²) | 1.9 | 1.6 | 0.50 |
| Maximum output Pmax (μW/cm²) | 0.35 | 0.26 | 0.17 |

From the results in Table 1, each photoelectric conversion element of Examples 1 and 2, which included the electron transport layer containing the perylene imide derivative of [Chemical Formula 1] or [Chemical Formula 2], had a high maximum output Pmax and thus had high photovoltaic conversion efficiency.

In contrast, Comparative Example 1, in which no perylene imide derivative was used, had a lower photovoltaic conversion efficiency than those of the photoelectric conversion elements of Examples 1 and 2.

REFERENCE SIGNS LIST

1 Electron transport layer
2 First electrode
3 Second electrode
4 Hole transport layer
5 Photosensitizer

The invention claimed is:

1. A photoelectric conversion element comprising:
a first electrode;
a second electrode arranged opposite to the first electrode;
an electron transport layer provided on a face of the first electrode, the face being opposite to the second electrode;
a photosensitizer supported on the electron transport layer; and
a hole transport layer interposed between the first electrode and the second electrode,
the electron transport layer containing a perylene imide derivative represented by a structure of [Chemical Formula 6]

[Chemical Formula 6]

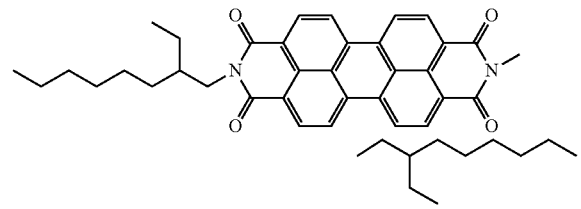

* * * * *